(12) United States Patent
Jeong

(10) Patent No.: US 7,858,516 B2
(45) Date of Patent: Dec. 28, 2010

(54) METHOD FOR FORMING FINE PATTERN OF SEMICONDUCTOR DEVICE

(75) Inventor: Eun-Soo Jeong, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 310 days.

(21) Appl. No.: 12/115,727

(22) Filed: May 6, 2008

(65) Prior Publication Data
US 2008/0305637 A1 Dec. 11, 2008

(30) Foreign Application Priority Data
May 7, 2007 (KR) ...................... 10-2007-0044094

(51) Int. Cl.
*H01L 21/31* (2006.01)
(52) U.S. Cl. ...................... 438/637; 438/669; 438/738; 257/E21.582
(58) Field of Classification Search .......... 257/E21.582, 257/E21.496, E21.577, E21.206, E21.038, 257/E21.039, E21.235, E21.236, E21.25, 257/49, 774, E21.584, E23.145; 438/669, 438/672, 634, 635, 637, 692, 710, 738, 717, 438/725, 706, 653, 675
See application file for complete search history.

(56) References Cited

U.S. PATENT DOCUMENTS 7,368,385 B2 * 5/2008 Nolscher et al. ............ 438/689
2002/0043690 A1 * 4/2002 Doyle et al. ................ 257/368

* cited by examiner

*Primary Examiner*—Tuan N. Quach
(74) *Attorney, Agent, or Firm*—Sherr & Vaughn, PLLC

(57) ABSTRACT

A method for forming a fine pattern of a semiconductor device which includes sequentially forming a non-etching layer and a sacrificial layer on a semiconductor substrate; and then forming a plurality of photo-resist layer patterns having a plurality of openings exposing the sacrificial layer; and then forming a plurality of first pattern grooves in the sacrificial layer etching the exposed sacrificial layer using the photo-resist patterns as an etching barrier; removing the photo-resist layer; and then forming an oxidation layer having a plurality of second pattern grooves on the sacrificial layer and in the first pattern grooves by performing a thermal oxidation process on the sacrificial layer; and then forming a plurality of first through-holes exposing the non-etching layer by completely removing the sacrificial layer remaining in oxidation layer; and then forming a plurality of patterns in the non-etching layer by etching the exposed portions of the non-etching layer using the oxidation layer as an etching barrier.

8 Claims, 7 Drawing Sheets

ETCHING

METHOD FOR FORMING FINE PATTERN OF SEMICONDUCTOR DEVICE

The present application claims priority under 35 U.S.C. §119 to Korean Patent Application No. 10-2007-0044094 (filed May 7, 2007), which is hereby incorporated by reference in its entirety.

BACKGROUND

Semiconductor devices may include a plurality of layers stacked one on another. Such semiconductor devices may be fabricated through a sequence of unit processes.

In general, a combination of a photo-lithography process and an etching process may be used to form a hole penetrating a predetermined layer or to form a trench pattern on a predetermined part of the semiconductor device.

Figure 1:
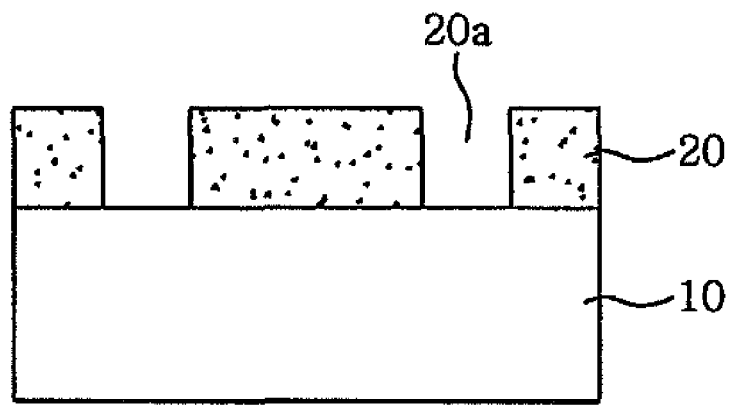
Figure 1:
Figure 1:
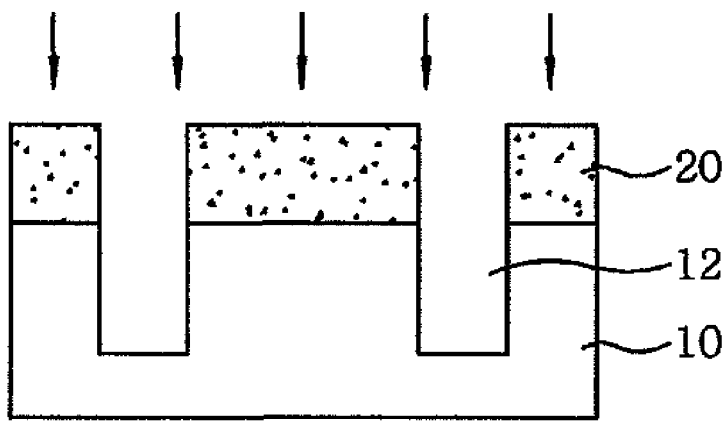
Figure 1:
Figure 1:
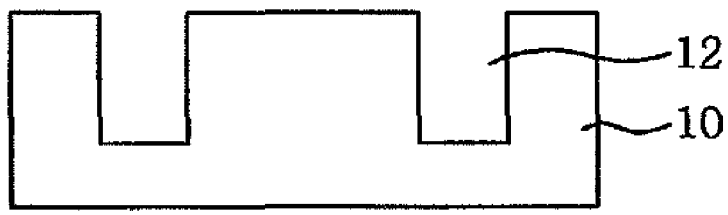

As illustrated in example FIG. 1, initially a photo-resist layer may be coated and then photo-resist pattern 20 formed on and/or over the photo-resist layer to have openings 20a at desired positions and have a desired shape through a photo-lithograph process that exposes and develops the photo-resist layer. Continuously, a dry etching process may be performed to vertically form pattern 12 by removing non-etching layer 10 that is exposed through openings 20a of photo-resist pattern 20. Photo-resist pattern 20 may be used as a barrier for etching. A reactive ion etching (RIE) process or an anisotropic etching may be performed as the dry etching process. Photo-resist pattern 20 may then be removed.

As semiconductor devices have become highly integrated, pattern 12 has also become smaller. In order to form such a fine pattern 12, a narrow band of light such as ArF and KrF may be used as a light source for exposing, and corresponding predetermined photo-resist layers that may be optically reacted with the described light sources may be used. However, it is difficult to form fine patterns of several nanometers due to limitations of optical resolution and a photoresist layer.

It is required to develop a method for forming a fine pattern 12 having a line width narrower than about ½ of a minimum line width that may be formed through a typical photo lithography process.

Since photo-resist layer pattern 20 may be used as an etching barrier, photo-resist pattern 20 must be thick enough to endure etching in order to form deep pattern 12. Therefore, it is difficult to secure a margin of a photoresist layer.

SUMMARY

Embodiments relate to a method for forming a fine pattern having a line width of several nanometers using a thermal oxidation process with a photo-lithography process.

Embodiments relate to a method for forming a fine pattern of a semiconductor device and, more particularly, to a method for forming a fine pattern having a line width narrower than about ½ of a minimum line width using a thermal oxidation process with a photo-lithography process.

Embodiments relate to a method for forming a fine pattern of a semiconductor device including at least one of the following steps: sequentially forming a non-etching layer and a sacrificial layer on a semiconductor substrate; and then rming a photo-resist patterns spaced apart by openings on the sacrificial layer, the openings exposing the sacrificial layer; and then forming first pattern grooves by removing portions of the exposed sacrificial layer, which by performing an etching process using the photo-resist patterns as an etching barrier; and then removing the photo-resist pattern; and then reducing a width of the sacrificial layer and forming second pattern grooves by forming an oxidation layer over the first pattern grooves and the sacrificial layer by performing a thermal oxidation process, the sacrificial layer and the second pattern grooves each having a width reduced by the oxidation layer; and then exposing the sacrificial layer by removing a uppermost surface of the oxidation layer; and then forming first through-holes exposing the non-etching layer by removing the sacrificial layers; and then forming fine patterns in the exposed portions of the non-etching layer by performing an etching process using the oxidation layer as an etching barrier; and then removing the oxidation layer.

Embodiments relate to a method for forming a fine pattern of a semiconductor device including at least one of the following steps: sequentially forming an non-etching layer and a sacrificial layer on a semiconductor layer; and then forming a photo-resist pattern having openings exposing the sacrificial layer; and then forming first pattern grooves by removing portions of the exposed sacrificial layer by performing an etching process using the photo-resist pattern as an etching barrier; and then removing the photo-resist pattern; and then performing a thermal oxidation process forming an oxidation layer in the first pattern grooves and on the sacrificial layer, the thermal oxidation process also reducing the width of the sacrificial layer while also forming second pattern grooves each having a width reduced by the oxidation layer formed in the first pattern grooves; and then exposing the sacrificial layer by removing a uppermost surface of the oxidation layer; and then forming first through-holes exposing portions of the non-etching layer by removing the sacrificial layer in the oxidation layer; and then forming second through-holes exposing portions of the non-etching layer not exposed by the first through-holes by etching the oxidation layer to penetrate the second pattern grooves; and then forming fine patterns in the exposed portions of the non-etching layer by performing an etching process using the oxidation layer as an etching barrier; and then removing the oxidation layer.

Embodiments relate to a method for forming a fine pattern of a semiconductor device including at least one of the following steps: sequentially forming a non-etching layer and a sacrificial layer on a semiconductor substrate; and then forming a plurality of photo-resist layer patterns having a plurality of openings exposing the sacrificial layer; and then forming a plurality of first pattern grooves in the sacrificial layer etching the exposed sacrificial layer using the photo-resist patterns as an etching barrier; removing the photo-resist layer; and then forming an oxidation layer having a plurality of second pattern grooves on the sacrificial layer and in the first pattern grooves by performing a thermal oxidation process on the sacrificial layer; and then forming a plurality of first through-holes exposing the non-etching layer by completely removing the sacrificial layer remaining in oxidation layer; and then forming a plurality of patterns in the non-etching layer by etching the exposed portions of the non-etching layer using the oxidation layer as an etching barrier.

DRAWINGS

Example FIG. 1 illustrates a method for forming a fine pattern of a semiconductor device.

Example FIGS. 2A through 2I illustrate a method for forming a fine pattern of a semiconductor device, in accordance with embodiments.

Example FIGS. 3A through 3J illustrate a method for forming a fine pattern of a semiconductor device, in accordance with embodiments.

DESCRIPTION

In accordance with embodiments, a fine pattern having a desired line width can be formed by forming a sacrificial layer on and/or over a non-etching layer, forming a pattern having a minimum line width through a photolithography process, and reducing the line width of the pattern by about ½ through performing a thermal oxidation process on the sacrificial layer.

Figure 2A:
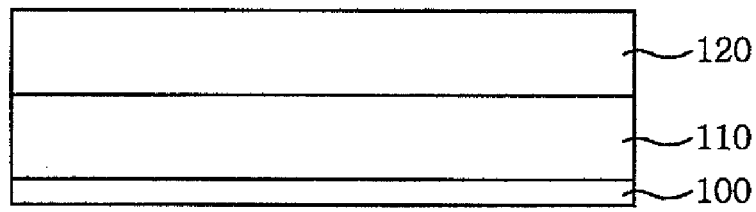

As illustrated in example FIG. 2a, non-etching layer 110 can be formed on and/or over semiconductor substrate 100 through deposition, and sacrificial layer 120 can be stacked on and/or over non-etching layer 110 through deposition. A fine pattern can be formed on non-etching layer 110 in a later process. Sacrificial layer 120 can be composed of material that can be easily terminally activated through a thermal oxidation process to provide atoms. Preferably, sacrificial layer 120 may be composed of at least one of poly silicon (Poly Si), silicon (Si) and titanium (Ti). Preferably, a low pressure chemical vapor deposition (LPCVD) process can be used for forming non-etching layer 110 and sacrificial layer 120.

Figure 2B:
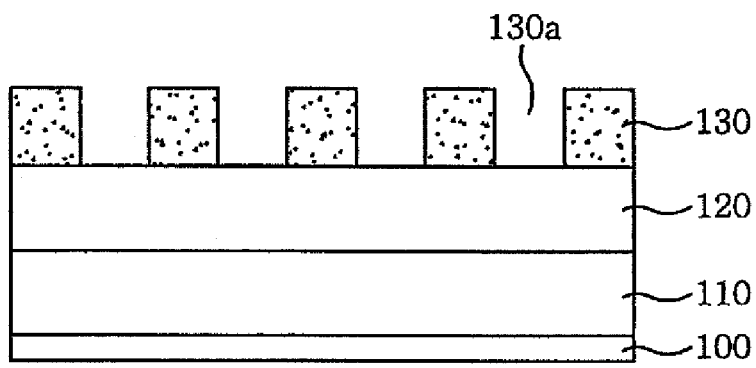

As illustrated in example FIG. 2B, photo-resist layer pattern 130 having openings 130a can then be formed on and/or over sacrificial layer 120 through a photolithography process that includes coating a photo-resist layer and then exposing and developing the photo-resist layer. The corresponding openings 130a have a minimum line width that can be formed through a photolithograph process. If it is necessary, a bottom of anti reflection coating (BARC) layer can be formed below photo-resist pattern 130 to prevent light from reflecting.

Figure 2C:
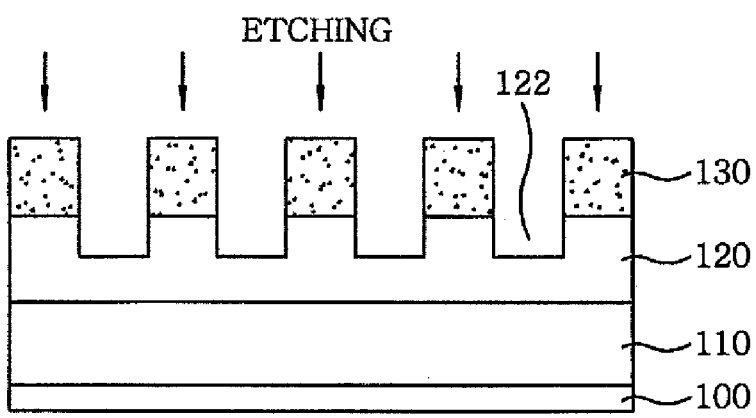

As illustrated in example FIG. 2C, first pattern grooves 122 can then be formed by removing a predetermined thickness of sacrificial layer 120 exposed through openings 130a of photo-resist pattern 130 by performing an etching process using photo-resist pattern 130 as an etching barrier. A reactive ion etching (RIE) process can be used for etching sacrificial layer 120.

Figure 2D:
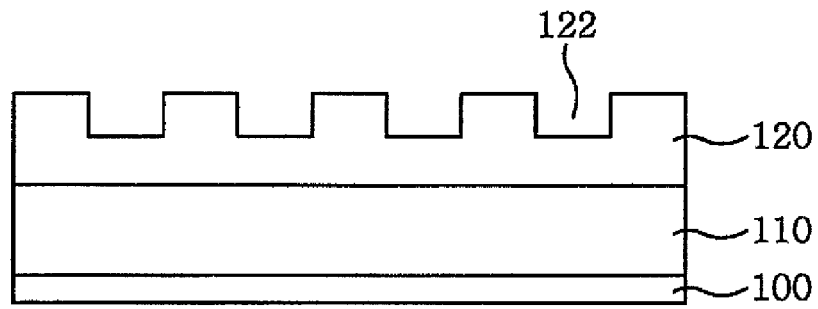

As illustrated in example FIG. 2D, photo-resist layer 130 and a non-reflective layer, which can be used for forming first pattern grooves 122, are removed. In order to remove photo-resist layer 130 and the non-reflective layer, an ashing process or a wet cleaning process can be used.

Figure 2E:
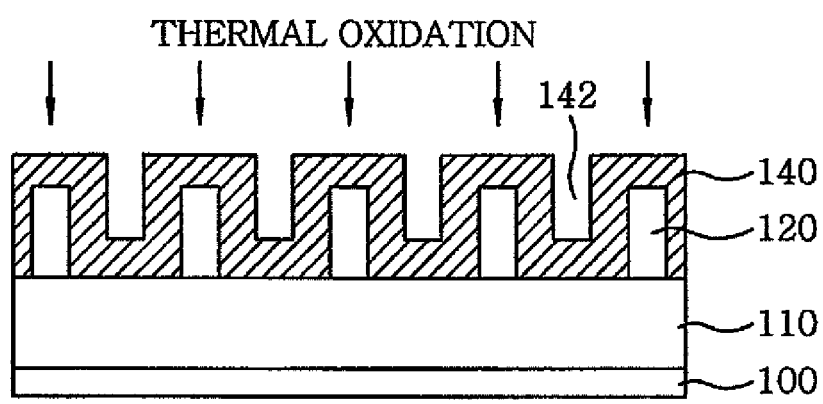

As illustrated in example FIG. 2E, oxidation layer 140 can then be formed on and/or over remaining sacrificial layer 120 including first pattern grooves 122 by performing a thermal oxidation process on and/or over sacrificial layer 120. The thermal oxidation process makes sacrificial layer 120 provide oxygen atoms so as to form oxidation layer 140 thereon. Since sacrificial layer 120 provides the atoms, the width and the thickness of sacrificial layer 120 can be significantly reduced.

Accordingly, second pattern grooves 142 with a line width reduced by ½ can be formed by oxidation layer 140 formed at both sides and a bottom of first pattern groove 122. Oxidation layer 140 may be composed of $SiO_2$ when sacrificial layer 120 is composed of poly silicon or silicon.

A width of each sacrificial layer 120 remaining between adjacent second pattern grooves 142 also become identical to that of second pattern groove 142. In this process, it is very important to properly control the time of the thermal oxidation process as a process condition in order to form second pattern groove 142 and each remaining sacrificial layer 120 to have a desired width.

Oxygen gas ($O_2$) can be used as a process gas for performing the thermal oxidation process. A furnace or a rapid thermal process (RTP) can also be used for the thermal oxidation process. Alternatively, wet thermal oxidation, dry thermal oxidation, and radical thermal oxidation can be used.

Figure 2F:
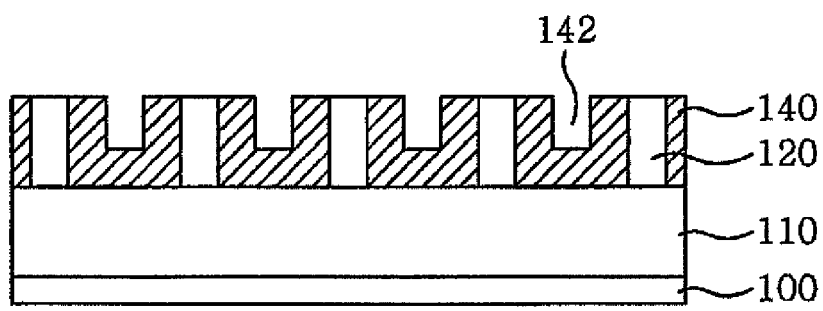

As illustrated in example FIG. 2F, an uppermost surface of sacrificial layer 120 can be exposed by evenly removing oxidation layer 140 by performing an oxide chemical-mechanical polishing (CMP) process or by etching the entire surface.

Figure 2G:
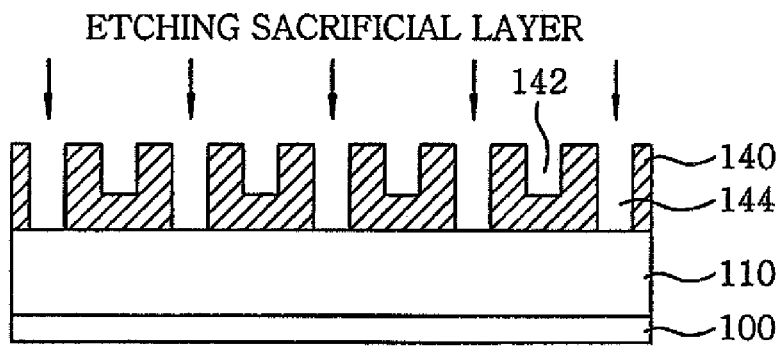

As illustrated in example FIG. 2G, first through-holes 144 can then be formed by completely removing sacrificial layer 120 remaining in oxidation layer 140 by performing an etching process with superior etching selectivity of sacrificial layer 120 against oxidation layer 140.

Figure 2H:
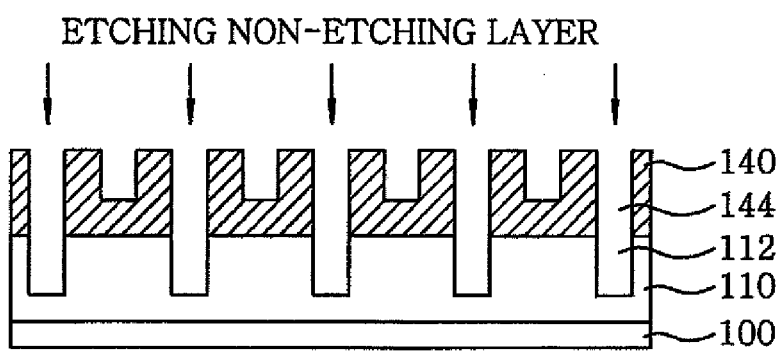

As illustrated in example FIG. 2H, final fine patterns 112 can then be formed by removing parts of non-etching layer 110 exposed through first through-holes 144 by performing an etching process using oxidation layer 140 having first through-holes 144 as an etching barrier. Fine pattern 112 can have a shape of a hole or a trench.

Figure 2I:
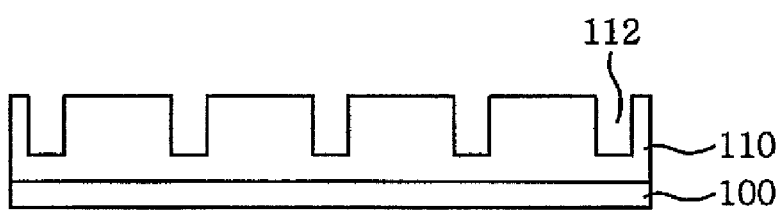

As illustrated in example FIG. 2I, oxidation layer 140 can then be removed by a dry etching process, a wet etching process, or a CMP process.

As described above, a fine pattern 112 having a predetermined line width which is equivalent to about ½ of a line width of a pattern, can be formed using a photo-lithography process. Also, a deep pattern 112 may be formed by performing an etching process using oxidation layer 140 as a hard mask.

Processes shown in example FIGS. 3A through 3G are identical to those illustrated and described in example FIGS. 2A through 2G. Meaning, the same processes can be performed until first through-holes 144 are formed in oxidation layer 140 in a method for forming fine pattern in accordance with embodiments illustrated in example FIGS. 3A through 3G.

Figure 3A:
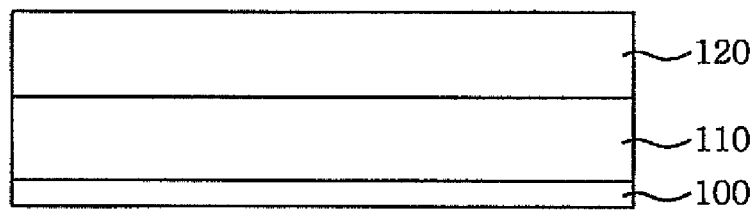
Figure 3B:
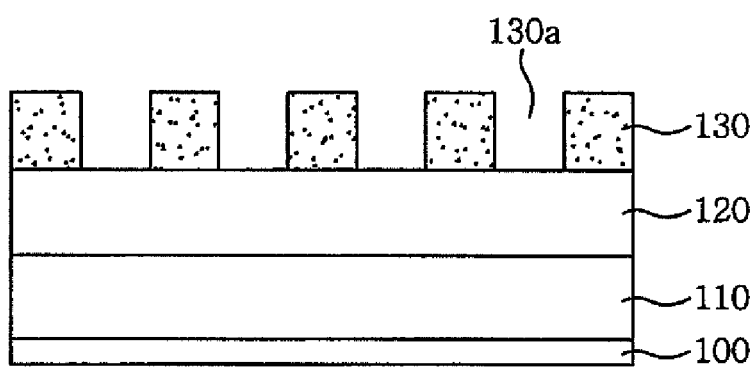
Figure 3C:
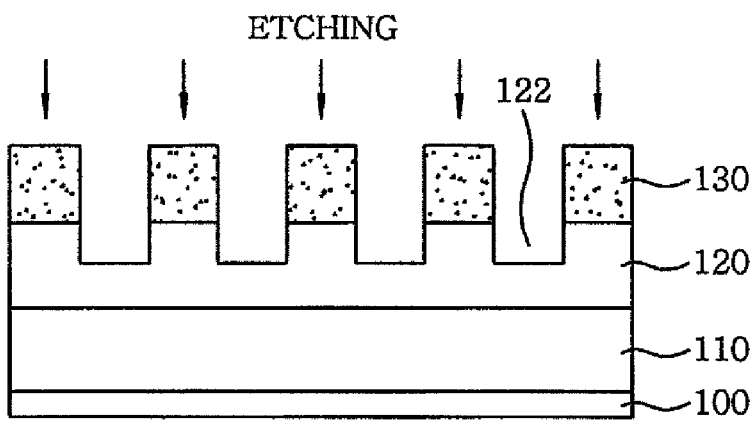
Figure 3D:
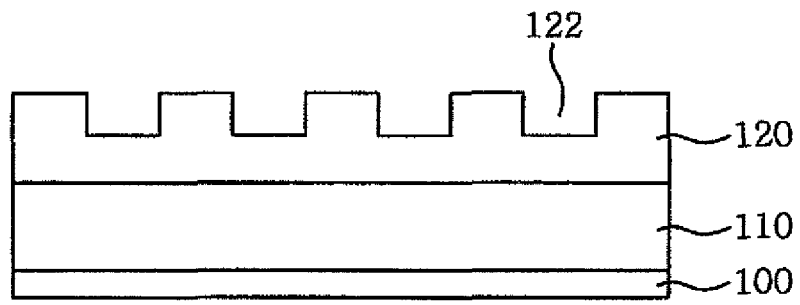
Figure 3E:
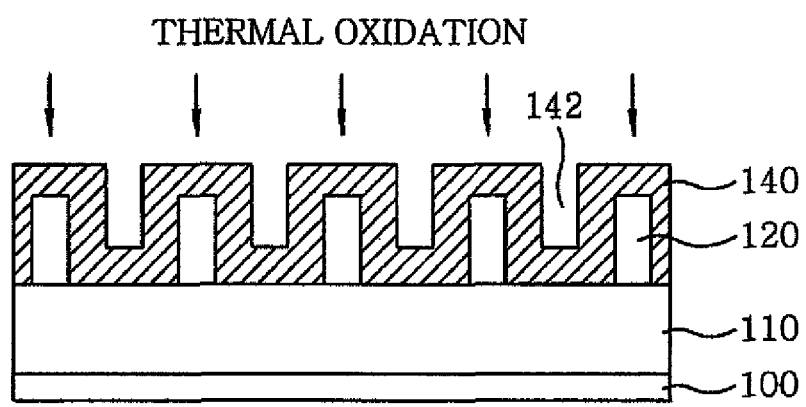
Figure 3F:
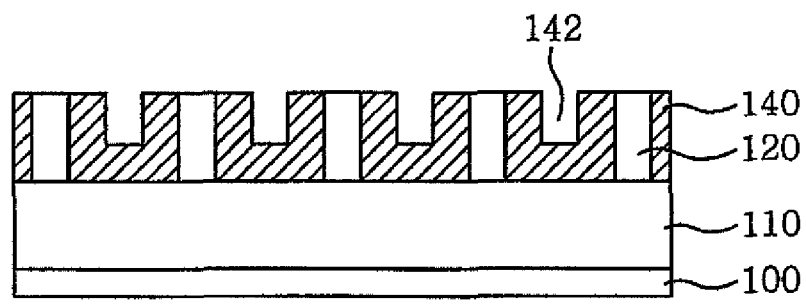
Figure 3G:
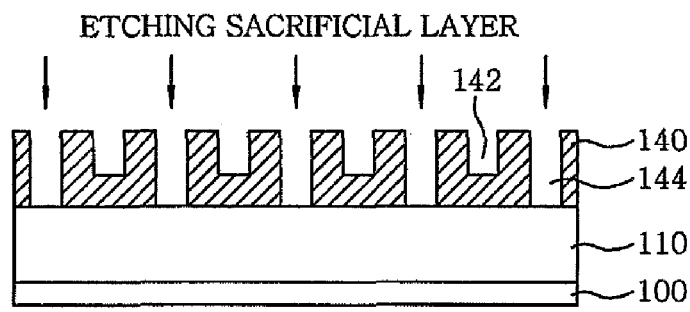
Figure 3H:
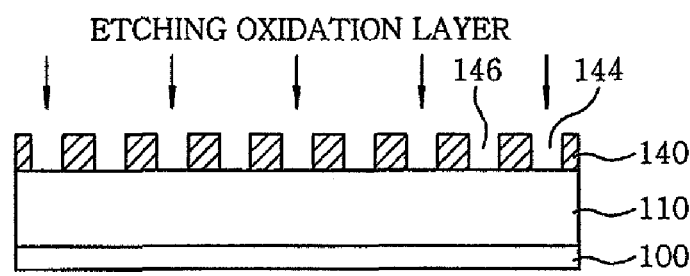

As illustrated in example FIG. 3H, second pattern grooves 142 are completely penetrated by partially etching the remaining oxidation layer 140, thereby forming second through-holes 146. An oxide RIE process can be performed as the etching process. Fine patterns 112 can then be formed densely by removing portions of non-etching layer 110 exposed through first through holes 144 and second through holes 146.

Figure 3I:
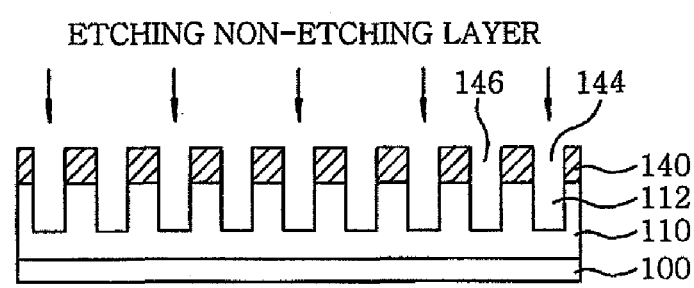
Figure 3J:
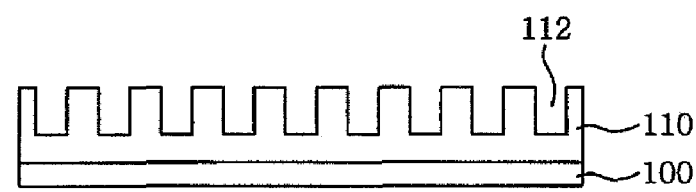

As illustrated in example FIG. 3I, fine patterns 112 can be formed by etching non-etching layer 110 using oxidation layer 140 having first through holes 144 and second through-holes 146 as an etching barrier. Oxidation layer 140 can then be removed. Fine patterns 112 can be formed more densely by performing the etching process using first through holes 144 and second through-holes 146 having the same line width.

As described above, the method for forming a fine pattern according to the present embodiments can form fine patterns of several nanometers, which is essential for manufacturing a highly integrated semiconductor device. Therefore, a performance and a quality of a semiconductor device can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

sequentially forming a non-etching layer and a sacrificial layer on a semiconductor substrate; and then forming a plurality of photo-resist layer patterns having a plurality of openings exposing the sacrificial layer; and then forming a plurality of first pattern grooves in the sacrificial layer by etching the exposed sacrificial layer to a predetermined depth using the photo-resist patterns as an etching barrier, wherein the predetermined depth is smaller than a thickness of the exposed sacrificial layer before being etched;

removing the photo-resist layer; and then performing a thermal oxidation process on the sacrificial layer such that a plurality of sacrificial layer patterns spaced apart from each other are formed on the non-etching layer and an oxidation layer is formed on the sacrificial layer patterns and the non-etching layer, wherein the sacrificial layer patterns have a width smaller than a distance between the first pattern grooves and the oxidation layer has a plurality of second pattern grooves disposed between the sacrificial layer patterns; and then forming a plurality of first through-holes exposing the non-etching layer by completely removing the sacrificial layer patterns; and then forming a plurality of patterns in the non-etching layer by etching the exposed portions of the non-etching layer using the oxidation layer as an etching barrier.

2. The method of claim 1, wherein forming the photo-resist patterns comprises:

coating a photo-resist layer on the sacrificial layer; and then exposing and developing the photo-resist layer to form the openings.

3. The method of claim 1, wherein the width of the sacrificial layer patterns is equal to the width of the second pattern grooves.

4. The method of claim 1, further comprising, before forming the plurality of first through-holes and after forming the oxidation layer, exposing the uppermost surface of the sacrificial layer patterns by performing chemical mechanical polishing process.

5. The method of claim 1, further comprising, after forming the plurality of patterns in the non-etching layer, removing the oxidation layer.

6. The method of claim 5, wherein the oxidation layer is removed by performing at least one of a dry etching process, a wet etching process and a CMP process.

7. The method of claim 1, wherein the thermal oxidation process is performed using oxygen $O_2$ gas.

8. The method of claim 1, wherein the sacrificial layer is composed of titanium.

* * * * *